United States Patent
Ning et al.

(10) Patent No.: US 11,922,023 B2
(45) Date of Patent: **\*Mar. 5, 2024**

(54) READ/WRITE METHOD AND MEMORY DEVICE

(71) Applicant: CHANGXIN MEMORY TECHNOLOGIES, INC., Anhui (CN)

(72) Inventors: Shuliang Ning, Hefei (CN); Jun He, Hefei (CN); Jie Liu, Hefei (CN); Zhan Ying, Hefei (CN)

(73) Assignee: CHANGXIN MEMORY TECHNOLOGIES, INC., Anhui (CN)

( \* ) Notice: Subject to any disclaimer, the term of this patent is extended or adjusted under 35 U.S.C. 154(b) by 299 days.

This patent is subject to a terminal disclaimer.

(21) Appl. No.: 17/310,495

(22) PCT Filed: Nov. 9, 2020

(86) PCT No.: PCT/CN2020/127508
§ 371 (c)(1),
(2) Date: Aug. 5, 2021

(87) PCT Pub. No.: WO2021/196619
PCT Pub. Date: Oct. 7, 2021

(65) Prior Publication Data
US 2022/0317891 A1    Oct. 6, 2022

(30) Foreign Application Priority Data

Apr. 1, 2020   (CN) .......................... 202010250011.0

(51) Int. Cl.
*G06F 11/00* (2006.01)
*G06F 3/06* (2006.01)
*G06F 11/10* (2006.01)

(52) U.S. Cl.
CPC .......... *G06F 3/0616* (2013.01); *G06F 3/0619* (2013.01); *G06F 3/0653* (2013.01); *G06F 3/0673* (2013.01); *G06F 11/1044* (2013.01)

(58) Field of Classification Search
None
See application file for complete search history.

(56) References Cited

U.S. PATENT DOCUMENTS

| 5,841,711 A | 11/1998 | Watanabe |
| 5,996,096 A | 11/1999 | Dell et al. |

(Continued)

FOREIGN PATENT DOCUMENTS

| CN | 1832049 A | 9/2006 |
| CN | 101145372 A | 3/2008 |

(Continued)

OTHER PUBLICATIONS

First Office Action of the Chinese application No. 202010250011.0, dated Feb. 15, 2023.

(Continued)

*Primary Examiner* — Mujtaba M Chaudry
(74) *Attorney, Agent, or Firm* — Syncoda LLC; Feng Ma (57) ABSTRACT

A read/write method includes: applying a read command to a memory device, the read command pointing to address information, reading to-be-read data from a storage cell corresponding to the address information to which the read command points, and if an error occurs in the to-be-read data, storing the address information to which the read command points in a preset storage space. The read/write operation is not performed on the address information stored in the preset storage space when the user executes the read or write operation on the memory device, which avoids a data error or data loss and greatly improves the reliability and prolongs the service life of the memory device.

15 Claims, 6 Drawing Sheets

(56) References Cited

U.S. PATENT DOCUMENTS

| | | | |
|---|---|---|---|
| 9,037,928 | B2 | 5/2015 | Kleveland et al. |
| 9,741,455 | B1 | 8/2017 | Park |
| 10,643,668 | B1 | 5/2020 | Poudyal et al. |
| 11,527,301 | B2 | 12/2022 | Ning |
| 2002/0097613 | A1 | 7/2002 | Raynham |
| 2002/0169996 | A1* | 11/2002 | King .................. G06F 11/0775 714/6.13 |
| 2003/0133336 | A1 | 7/2003 | Chen |
| 2003/0156469 | A1 | 8/2003 | Viehmann et al. |
| 2004/0003315 | A1 | 1/2004 | Lakhani et al. |
| 2006/0140027 | A1 | 6/2006 | Tominaga |
| 2007/0113155 | A1 | 5/2007 | Takahashi |
| 2007/0294570 | A1 | 12/2007 | Polisetti et al. |
| 2008/0181035 | A1 | 7/2008 | Kawasumi |
| 2010/0229033 | A1 | 9/2010 | Maeda |
| 2010/0269000 | A1 | 10/2010 | Lee |
| 2010/0332895 | A1 | 12/2010 | Billing et al. |
| 2010/0332950 | A1 | 12/2010 | Billing |
| 2011/0119558 | A1 | 5/2011 | Koshiyama |
| 2012/0166710 | A1 | 6/2012 | Ou |
| 2012/0254511 | A1 | 10/2012 | Yeh |
| 2014/0075265 | A1 | 3/2014 | Hung |
| 2014/0177324 | A1 | 6/2014 | Liu |
| 2014/0189215 | A1 | 7/2014 | Kang |
| 2014/0376320 | A1 | 12/2014 | Loh et al. |
| 2015/0019804 | A1 | 1/2015 | Nemazie et al. |
| 2015/0127972 | A1 | 5/2015 | Chun et al. |
| 2015/0143198 | A1 | 5/2015 | Chun et al. |
| 2015/0186198 | A1 | 7/2015 | Dong et al. |
| 2015/0205664 | A1 | 7/2015 | Janik |
| 2015/0293809 | A1 | 10/2015 | Liang |
| 2015/0347254 | A1 | 12/2015 | Jones et al. |
| 2015/0363425 | A1 | 12/2015 | Li et al. |
| 2016/0147599 | A1 | 5/2016 | Kim |
| 2016/0357462 | A1* | 12/2016 | Nam ..................... G06F 3/0613 |
| 2016/0364153 | A1* | 12/2016 | Nam ..................... G06F 11/00 |
| 2017/0123879 | A1 | 5/2017 | Donlin |
| 2017/0132075 | A1* | 5/2017 | Zastrow ............. G06F 11/1048 |
| 2017/0139839 | A1 | 5/2017 | Ke |
| 2017/0262178 | A1 | 9/2017 | Hashimoto |
| 2017/0308433 | A1* | 10/2017 | Kwon .................... G11C 29/52 |
| 2017/0372799 | A1 | 12/2017 | Bacchus |
| 2018/0158535 | A1* | 6/2018 | Kim ...................... G11C 29/783 |
| 2019/0129776 | A1 | 5/2019 | Hsiao |
| 2019/0371391 | A1 | 12/2019 | Cha et al. |
| 2019/0377631 | A1 | 12/2019 | Hattori |
| 2019/0385693 | A1 | 12/2019 | Shin et al. |
| 2020/0004652 | A1 | 1/2020 | Niu et al. |
| 2021/0055981 | A1 | 2/2021 | Miller |
| 2021/0311836 | A1 | 10/2021 | Ning |
| 2022/0035719 | A1 | 2/2022 | Niu |

FOREIGN PATENT DOCUMENTS

| | | |
|---|---|---|
| CN | 101593157 A | 12/2009 |
| CN | 101777013 A | 7/2010 |
| CN | 101908023 A | 12/2010 |
| CN | 101937374 A | 1/2011 |
| CN | 101937725 A | 1/2011 |
| CN | 102004698 A | 4/2011 |
| CN | 102053818 A | 5/2011 |
| CN | 102063940 A | 5/2011 |
| CN | 102203740 A | 9/2011 |
| CN | 102592680 A | 7/2012 |
| CN | 103019873 A | 4/2013 |
| CN | 103247345 A | 8/2013 |
| CN | 103269230 A | 8/2013 |
| CN | 103309775 A | 9/2013 |
| CN | 103778065 A | 5/2014 |
| CN | 103839591 A | 6/2014 |
| CN | 103955430 A | 7/2014 |
| CN | 103955431 A | 7/2014 |
| CN | 104063186 A | 9/2014 |
| CN | 105723344 A | 6/2016 |
| CN | 105740163 A | 7/2016 |
| CN | 105788648 A | 7/2016 |
| CN | 105868122 A | 8/2016 |
| CN | 105893178 A | 8/2016 |
| CN | 106569742 A | 4/2017 |
| CN | 106776362 A | 5/2017 |
| CN | 107247563 A | 10/2017 |
| CN | 107402836 A | 11/2017 |
| CN | 107766173 A | 3/2018 |
| CN | 110673980 A | 1/2020 |
| JP | 2007103009 A | 4/2007 |
| JP | 6275427 B2 | 2/2018 |
| TW | 201706842 A | 2/2017 |
| WO | 2012019475 A1 | 2/2012 |

OTHER PUBLICATIONS

First Office Action of the Chinese application No. 202010249668.5, dated Jan. 12, 2023.
First Office Action of the Chinese application No. 202010249989.5, dated Jan. 19, 2023.
First Office Action of the Chinese application No. 202010250023.3, dated Jan. 19. 2023.
Supplementary European Search Report in the European application No. 20928574.1, dated Oct. 11, 2022.
First Office Action of the European application No. 20928300.1, dated Feb. 22, 2023.
Written Opinion of the International Search Authority in the international application No. PCT/CN2020/127508, dated Feb. 18, 2021.
Written Opinion of the International Search Authority in the international application No. PCT/CN2020/130388, dated Feb. 23, 2021.
Written Opinion of the International Search Authority in the international application No. PCT/CN2020/130389, dated Feb. 24, 2021.
Written Opinion of the International Search Authority in the international application No. PCT/CN2020/130390, dated Feb. 24, 2021.
Written Opinion of the International Search Authority in the international application No. PCT/CN2020/130391, dated Jan. 20, 2021.
Written Opinion of the International Search Authority in the international application No. PCT/CN2020/127531, dated Feb. 7, 2021.
Written Opinion of the International Search Authority in the international application No. PCT/CN2020/127584, dated Feb. 18, 2021.
Written Opinion of the International Search Authority in the international application No. PCT/CN2020/127978, dated Feb. 10, 2021.
First Office Action of the Chinese application No. 202010250426.8, dated Feb. 16, 2023.
Non-Final Office Action in U.S. Appl. No. 17/342,492, dated Apr. 26, 2022.
The extended European Search Report in Application No. 20928031.2, dated Jun. 2, 2022.
The extended European Search Report in Application No. 20926376.3, dated Jun. 13, 2022.
Extended European Search Report in Application No. 20929597.1, dated Oct. 11, 2022.
Extended European Search Report in Application No. 20929096.4, dated Sep. 28, 2022.
International Search Report (ISR) in the PCT/CN2020/127508 dated Feb. 18, 2021.
Extended European Search Report in Application No. 20928300.1, dated Jul. 19, 2022.
Extended European Search Report in Application No. 20928575.8, dated Jul. 4, 2022.
International Search Report in Application No. PCT/CN2020/130388, dated Feb. 23, 2021.
International Search Report in Application No. PCT/CN2020/127531, dated Feb. 7, 2021.
International Search Report in Application No. PCT/CN2020/127584, dated Feb. 18, 2021.
International Search Report in Application No. PCT/CN2020/127978, dated Feb. 10, 2021.
International Search Report in Application No. PCT/CN2020/130389, dated Feb. 24, 2021.
International Search Report in Application No. PCT/CN2020/130390, dated Feb. 24, 2021.

(56) References Cited

OTHER PUBLICATIONS

International Search Report in Application No. PCT/CN2020/130391, dated Jan. 20, 2021.
First Office Action of the U.S. Appl. No. 17/396,692, dated Jul. 7, 2023. 53 pages.
First Office Action of the U.S. Appl. No. 17/342,498, dated Jul. 19, 2023. 71 pages.
First Office Action of the U.S. Appl. No. 17/353,824, dated Jul. 20, 2023. 69 pages.
First Office Action of the U.S. Appl. No. 17/347,525, dated Aug. 2, 2023. 71 pages.
First Office Action of the U.S. Appl. No. 17/363,013, dated Aug. 3, 2023. 81 pages.
First Office Action of the U.S. Appl. No. 17/310,415, dated Aug. 9, 2023. 50 pages.
First Office Action of the Chinese application No. 202010250008.9, dated Jul. 1, 2023. 9 pages with English abstract.
Supplementary European Search Report in the European application No. 20926358.1, dated Jul. 17, 2023. 7 pages.

* cited by examiner

READ/WRITE METHOD AND MEMORY DEVICE

CROSS-REFERENCE TO RELATED APPLICATIONS

This application is a national stage of International Application No. PCT/CN2020/127508 filed on Nov. 9, 2020, which claims priority to Chinese Patent Application No. 202010250011.0 filed on Apr. 1, 2020. The disclosures of these applications are hereby incorporated by reference in their entirety.

FILED OF THE INVENTION

The present disclosure relates to the field of semiconductor storage, in particular to a read/write method and a memory device.

BACKGROUND OF THE INVENTION

A semiconductor memory is a memory component configured to store various data information. With the increase of circuit complexity, various forms of memories are inevitably prone to produce defective or damaged storage cells in the process of manufacture or use, which leads to the reduction of reliability of the semiconductor memory.

Therefore, how to avoid the above situation has become an urgent problem to be solved.

SUMMARY OF THE INVENTION

A technical problem to be solved by the present disclosure is to provide a read/write method and a memory device, which can greatly improve the reliability and prolong the service life of the memory device.

To solve the above problem, the present disclosure provides a read/write method, including: applying a read command to a memory device, the read command pointing to address information, reading to-be-read data from a storage cell corresponding to the address information to which the read command points, and storing the address information to which the read command points in a preset storage space if an error occurs in the to-be-read data.

Further, if no error occurs in the to-be-read data, the address information to which the read command points is not stored in the preset storage space.

Further, the step of reading to-be-read data from a storage cell corresponding to the address information to which the read command points further includes: reading first ECC code corresponding to the to-be-read data from the storage cell corresponding to the address information to which the read command points; and a method of judging whether an error occurs in the to-be-read data includes: decoding the first ECC code to judge whether an error occurs in the to-be-read data.

Further, the method includes: applying a write command to the memory device, comparing address information to which the write command points with the address information stored in the preset storage space, executing a write operation on a storage cell corresponding to the address information to which the write command points if the address information to which the write command points is not the same as the address information stored in the preset storage space, and stopping the write operation on the storage cell corresponding to the address information to which the write command points if the address information to which the write command points is the same as the address information stored in the preset storage space.

Further, after the step of stopping the write operation on the storage cell corresponding to the address information to which the write command points, the method further includes the following step: changing the address information to which the write command points into another address information.

Further, after the step of changing the address information to which the write command points into another address information, the method further includes the following steps: comparing the another address information with the address information stored in the preset storage space, stopping the write operation on a storage cell corresponding to the another address information if the another address information is the same as the address information stored in the preset storage space, and executing the write operation on the storage cell corresponding to the another address information if the another address information is not the same as the address information stored in the preset storage space.

Further, the step of executing a write operation on a storage cell corresponding to the address information to which the write command points further includes: forming second ECC code corresponding to to-be-written data in the write operation, and writing the second ECC code together with the to-be-written data into the storage cell corresponding to the address information to which the write command points.

Further, after the step of applying a read command to a storage device and before the step of reading to-be-read data from a storage cell corresponding to the address information to which the read command points, the method further includes: comparing the address information to which the read command points with the address information stored in the preset storage space, and executing a read operation on the storage cell corresponding to the address information to which the read command points if the address information to which the read command points is not the same as the address information stored in the preset storage space.

Further, if the address information to which the read command points is the same as the address information stored in the preset storage space, it is judged whether a write command has been executed on the address information to which the read command points after the address information to which the read command points is stored in the preset storage space, and if yes, the read command points to address information to which the write command points, so as to perform a read operation on a storage cell corresponding thereto.

The present disclosure further provides a memory device, including: a command receiving unit configured to receive a read command or a write command; a storage cell corresponding to address information to which the read command or the write command points; an execution unit configured to execute a read operation or a write operation on the storage cell; and a preset storage space configured to store address information corresponding to the storage cell where a data error occurs.

Further, the memory device further includes an ECC code decoding unit configured to decode first ECC code corresponding to to-be-read data in the read operation and form second ECC code corresponding to to-be-written data in the write operation.

Further, the memory device further includes a comparison unit, and the comparison unit is connected to the command receiving unit and the preset storage space and is configured to compare the address information to which the read command or the write command points with the address information stored in the preset storage space.

Further, the execution unit is further connected to the comparison unit, and is configured to, according to a result output by the comparison unit, execute a read operation or a write operation on the storage cell corresponding to the address information to which the read command or the write command points, or stop the read operation or the write operation on the storage cell corresponding to the address information to which the read command or the write command points.

Further, the memory device further includes a judgment unit, and the judgment unit is connected to the command receiving unit and the execution unit and is configured to judge whether a write command has been executed on the address information to which the read command points after the address information to which the read command points is stored in the preset storage space.

Further, the memory device further includes a conversion unit configured to change the address information to which the read command or the write command points into another address information after the read operation or the write operation on the storage cell corresponding to the address information to which the read command or the write command points is stopped.

Further, the memory device includes a logic layer and at least one storage layer, the command receiving unit and the execution unit are arranged in the logic layer, the storage cell is arranged in the storage layer, and the preset storage space is arranged in the storage layer or the logic layer.

The present disclosure has the following advantages. When a user executes a read/write operation on the memory device, address information corresponding to a storage cell where a data error occurs is stored in the preset storage space, so as to distinguish a valid storage cell from an invalid storage cell in real time. That is, each time a read operation is performed, address information corresponding to the invalid storage cell may be stored in the preset storage space, so that the read/write operation is not performed on the address information stored in the preset storage space when the user executes the read or write operation on the memory device, which avoids a data error or data loss and greatly improves the reliability and prolongs the service life of the memory device.

DETAILED DESCRIPTION

Specific embodiments of the read/write method and the memory device provided in the present disclosure are described in detail below with reference to the accompanying drawings.

A common method of improving the reliability of a memory device is to encode data into Error Correction Code (ECC) before the data is written into the memory device, and store the data and the ECC in the memory device. The data and the ECC are read simultaneously during reading. The ECC is decoded to restore data where an error may have occurred.

However, the inventor finds that the ECC can only correct the data as the data is being read, and that a storage cell in the memory where the data error occurs still exists. If, in a subsequent data storage process, at least one storage cell with the data error appears in a storage segment corresponding to the storage cell where the data error occurs, the storage segment may have at least two storage cells with the data error. The ECC cannot correct the error. As a result, the storage segment cannot be used, or even the memory device cannot be used, thus affecting the reliability and the service life of the memory device.

According to the applicant's research findings, if a storage cell where a data error occurs can be distinguished in real time when a user uses the memory device, a basis for execution of a subsequent read/write operation can be provided, and the reliability of the memory device can be greatly improved. Therefore, the present disclosure provides a read/write method, which can distinguish, in real time, a storage cell where a data error occurs.

In a first specific embodiment of the read/write method of the present disclosure, when a read operation is executed, address information corresponding to a storage cell where an error occurs in to-be-read data is stored in a preset storage space, so as to distinguish the storage cell where the error occurs in the to-be-read data from storage cells where no error occurs in the to-be-read data. Specifically, refer to FIG. 1 which is a schematic flowchart of a first specific embodiment of a read/write method according to the present disclosure. The read/write method includes the following steps.

Figure 1:
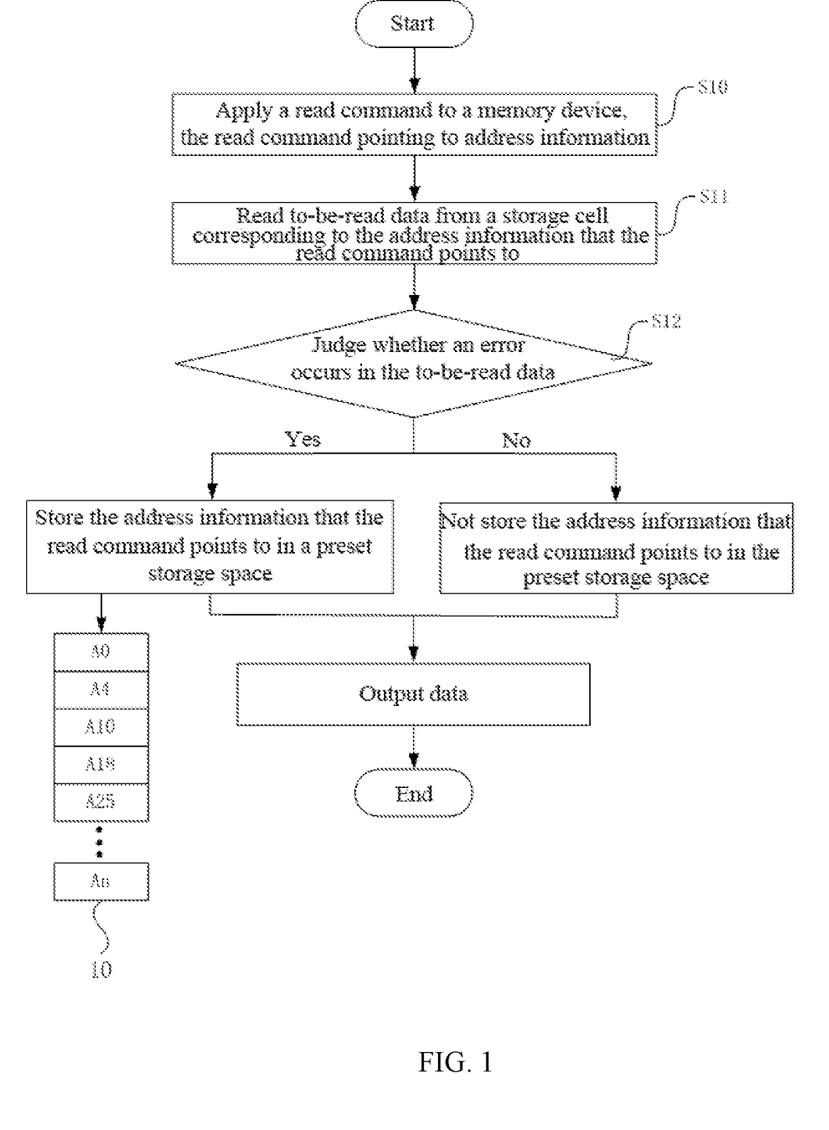
FIG. 1 is a schematic flowchart of a first specific embodiment of a read/write method according to the present disclosure.

In step S10, a read command is applied to a memory device, the read command pointing to address information. For example, the address information to which the read command points is A0.

In step S11, to-be-read data is read from a storage cell corresponding to the address information to which the read command points. For example, the to-be-read data is read from a storage cell corresponding to the address information A0.

In step S12, it is judged whether an error occurs in the to-be-read data.

If an error occurs in the to-be-read data, indicating that the storage cell is invalid, the address information to which the read command points is stored in a preset storage space 10.

For example, if an error occurs in the to-be-read data read from the storage cell corresponding to the address information A0 to which the read command points, the address information A0 to which the read command points is stored in the preset storage space 10; if an error occurs in to-be-read data read from a storage cell corresponding to address information A4 to which the read command points, the address information A4 to which the read command points is stored in the preset storage space 10.

The preset storage space 10 may be a static random-access memory (SRAM), a dynamic random-access memory (DRAM), a magnetic access memory (MRAM), a register, a latch, a flip-flop, or other structures well-known to those skilled in the art and having a storage function. If no error occurs in the to-be-read data, indicating that the storage cell is valid, the address information to which the read command points is not stored in the preset storage space 10.

For example, if no error occurs in to-be-read data read from a storage cell corresponding to address information A1 to which the read command points, the address information A1 to which the read command points is not stored in the preset storage space 10; if no error occurs in to-be-read data read from a storage cell corresponding to address information A2 to which the read command points, the address information A2 to which the read command points is not stored in the preset storage space 10.

Further, the present disclosure further provides a method of judging whether an error occurs in the to-be-read data. Specifically, the step of reading to-be-read data from a storage cell corresponding to the address information to which the read command points further includes: reading first ECC code corresponding to the to-be-read data from the storage cell corresponding to the address information to which the read command points. For example, the number of bits of data read from the storage cell corresponding to the address information to which the read command points is 64 b+8 b, wherein 64 b is the number of bits of the to-be-read data and 8 b is the number of bits of the first ECC code. The first ECC code is decoded according to a corresponding algorithm, which may restore data where an error may have occurred. The algorithm is a prior art and is not described in detail. Therefore, it may be judged, based on decoding of the first ECC code, whether an error occurs in the to-be-read data.

The present disclosure enumerates a method of judging, based on decoding of the first ECC code, whether an error occurs in the to-be-read data: recoding the to-be-read data to form new ECC code, performing OR comparison on each bit of the new ECC code and the first ECC code, and if the new ECC code and the first ECC code are identical in each bit, indicating that no error occurs in the to-be-read data and that the storage cell is valid, and not storing address information corresponding to the storage cell in the preset storage space 10; and if the new ECC code and the first ECC code are not identical in each bit, indicating that an error occurs in the to-be-read data and that the storage cell is invalid, and storing the address information corresponding to the storage cell in the preset storage space 10.

If no error occurs in the to-be-read data, the to-be-read data is taken as output data of the memory device, and if an error occurs in the to-be-read data, the first ECC code can be used to restore the data and the restored data can be used as output data of the memory device.

According to the read/write method of the present disclosure, address information corresponding to a storage cell where a data error occurs is distinguished from a storage cell where no data error occurs by using the preset storage space 10, so that in a subsequent read/write operation, it can be determined according to whether address information that a read command or a write command points to is located in the preset storage space 10, whether a read operation or a write operation is executed on the address information, which avoids a data error or data loss, greatly improves the reliability of the memory device, and prolongs the service life of the memory device.

A second specific embodiment is further provided for the read/write method of the present disclosure. After the step of applying a read command to a storage device and before the step of reading to-be-read data from a storage cell corresponding to the address information to which the read command points, the method further includes a comparison step. Specifically, refer to FIG. 2 which is a schematic flowchart of a second specific embodiment of the read/write method according to the present disclosure.

Figure 2:
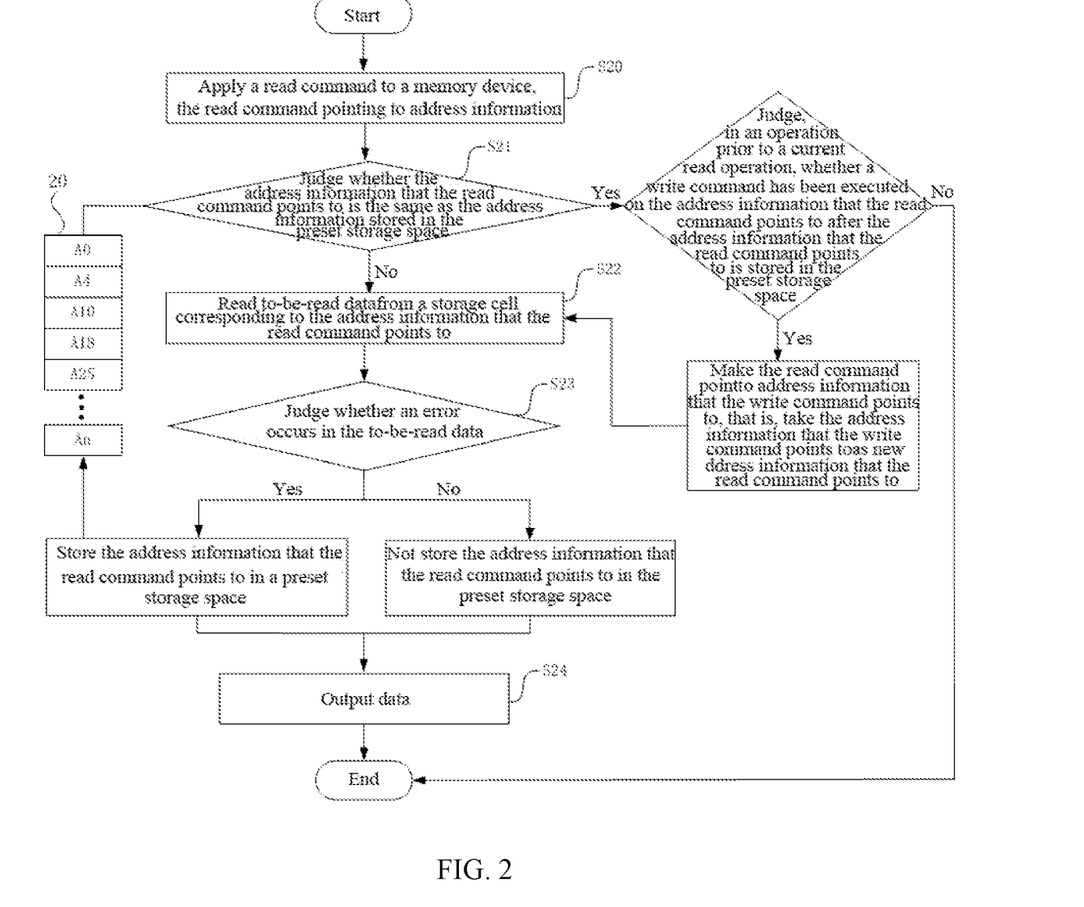
FIG. 2 is a schematic flowchart of a second specific embodiment of the read/write method according to the present disclosure.

In step S20, a read command is applied to a memory device, the read command pointing to address information.

In step S21, the address information to which the read command points is compared with the address information stored in the preset storage space 20. That is, it is judged whether the address information to which the read command points is the same as the address information stored in the preset storage space 20.

If the address information to which the read command points is not the same as the address information stored in the preset storage space 20, indicating that the address information to which the read command points is not stored in the preset storage space 20, a storage cell corresponding to the address information to which the read command points is a valid storage cell, and a read operation is executed on the storage cell corresponding to the address information to which the read command points, that is, step S22 is performed.

For example, if the address information to which the read command points is A1, the address information A1 to which the read command points is compared with the address information stored in the preset storage space 20; if the address information A1 to which the read command points is not the same as any piece of the address information stored in the preset storage space 20, indicating that the address information A1 to which the read command points is not stored in the preset storage space 20, a read operation is executed on a storage cell A1 corresponding to the address information to which the read command points, that is, step S22 is performed. In step S22, the address information to which the read command points is A1.

If the address information to which the read command points is the same as the address information stored in the preset storage space 20, indicating that the address information to which the read command points is stored in the preset storage space 20, a storage cell corresponding to the address information to which the read command points is an invalid storage cell. Then, the following step is performed: judging, in an operation prior to a current read operation, whether a write command has been executed on the address information to which the read command points after the address information to which the read command points is stored in the preset storage space 20. If yes, the read command points to address information to which the write command points, that is, the address information to which the write command points is taken as new address information to which the read command points, and step S22 is performed on the new address information. If no, there are two processing manners. One processing manner is stopping the read operation as shown in FIG. 2 in the present specific embodiment; and the other processing manner is continuing the read operation and taking the data restored using the first ECC code as output data of the memory device.

For example, the address information A4 to which the read command points is the same as the address information stored in the preset storage space 20, that is, the address information A4 to which the read command points is stored in the preset storage space 20, and it is judged, in an operation prior to the current read operation, whether a write command has been executed on the address information A4 to which the read command points after the address information A4 to which the read command points is stored in the preset storage space 20. If yes, and the write command points to another address information A5, the read command points to the address information A5 to which the write command points, so as to execute a read operation on a storage cell corresponding thereto, that is, step S22 is performed. The address information to which the read command points in step S22 is the address information A5. Specific implementation of the write command may be obtained with reference to a third specific embodiment. If no, the read operation is stopped.

In step S22, to-be-read data is read from a storage cell corresponding to the address information to which the read command points. For example, to-be-read data is read from a storage cell corresponding to the address information A1 to which the read command points. This step is the same as step S11 in the first specific embodiment.

In step S23, it is judged whether an error occurs in the to-be-read data. This step is the same as step S12 in the first specific embodiment. If an error occurs in the to-be-read data, indicating that the storage cell is invalid, the address information to which the read command points is stored in the preset storage space 20. If no error occurs in the to-be-read data, indicating that the storage cell is valid, the address information to which the read command points is not stored in the preset storage space 20.

In step S24, data is output.

In the second specific embodiment, after the read command is applied to the memory device, the address information to which the read command points is compared with the address information stored in the preset storage space 20, so as to judge whether the address information to which the read command points is stored in the preset storage space 20, so that a read command can be selectively executed on the address information to which the read command points, thereby improving the reliability of the memory device. In addition, after the to-be-read data is read, it may also be selected, according to whether an error occurs in the to-be-read data, whether to store the address information of the storage cell in the preset storage space 20, so as to provide a judgment basis for a subsequent read/write operation.

A third specific embodiment is further provided for the read/write method of the present disclosure. The third specific embodiment is a write operation on the memory device. Specifically, refer to FIG. 3 which is a schematic flowchart of a third specific embodiment of the read/write method according to the present disclosure.

Figure 3:
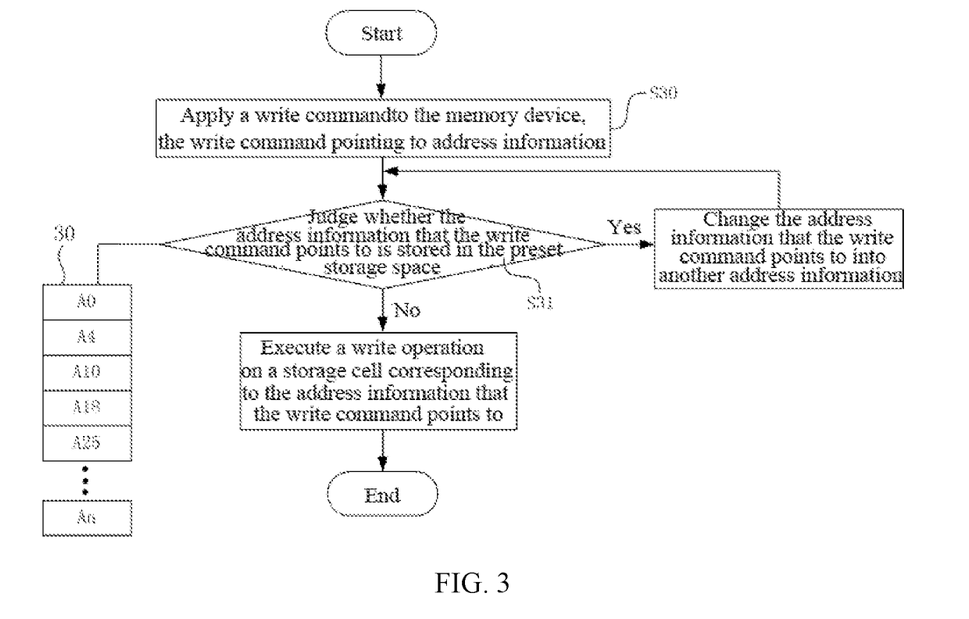
FIG. 3 is a schematic flowchart of a third specific embodiment of the read/write method according to the present disclosure.

In step S30, a write command is applied to the memory device, the write command pointing to address information. For example, a write command is applied to the memory device, and the write command points to address information A0.

In step S31, the address information to which the write command points is compared with the address information stored in the preset storage space 30, that is, it is judged whether the address information to which the write command points is stored in the preset storage space 30.

If the address information to which the write command points is not the same as the address information stored in the preset storage space 30, that is, the address information to which the write command points is not stored in the preset storage space 30, a write operation is executed on a storage cell corresponding to the address information to which the write command points. If the address information to which the write command points is the same as the address information stored in the preset storage space 30, that is, the address information to which the write command points is stored in the preset storage space 30, the write operation on the storage cell corresponding to the address information to which the write command points is stopped.

For example, the address information to which the write command points is address information A1, and the address information A1 is compared with the address information stored in the preset storage space 30. If the address information A1 is not the same as any piece of the address information stored in the preset storage space 30, indicating that the address information A1 to which the write command points is not stored in the preset storage space 30, a write operation is executed on a storage cell corresponding to the address information A1 to which the write command points.

In another example, the address information to which the write command points is address information A4, and the address information A4 is compared with the address information stored in the preset storage space 30. If the address information A4 is the same as one piece of the address information stored in the preset storage space 30, indicating that the address information A4 to which the write command points is stored in the preset storage space 30, the write operation on a storage cell corresponding to the address information A4 to which the write command points is stopped.

Further, in the present third specific embodiment, after the step of stopping the write operation on the storage cell corresponding to the address information to which the write command points, the method further includes the following step: changing the address information to which the write command points into another address information. After the step, the another address information may also be compared with the address information stored in the preset storage space 30. The comparison method is the same as step S31. The write operation on a storage cell corresponding to the another address information is stopped if the another address information is the same as the address information stored in the preset storage space 30, and the write operation is executed on the storage cell corresponding to the another address information if the another address information is not the same as the address information stored in the preset storage space 30.

For example, after the step of stopping the write operation on the storage cell corresponding to the address information A0 to which the write command points, the address information A0 to which the write command points is changed into another address information A1, that is, the write command points to the address information A1 after the step. Further, the address information A1 to which the write command points is compared with the address information stored in the preset storage space 30, that is, it is judged whether the address information A1 is stored in the preset storage space 30. For example, in the present specific embodiment, if the address information A1 is not the same as any piece of the address information stored in the preset storage space 30, that is, the address information A1 is not stored in the preset storage space 30, a write operation is executed on a storage cell corresponding to the address information A1. For example, in other specific embodiments, if the address information A1 is the same as one piece of the address information stored in the preset storage space 30, that is, the address information A1 is stored in the preset storage space 30, the write operation on the storage cell corresponding to the address information A1 is stopped, the address information of the write command is changed into A2, and the address information A2 is compared with the address information stored in the preset storage space 30, that is, it is judged whether the address information A2 is stored in the preset storage space 30, and so on, until the address information to which the write command points is not the same as any piece of the address information stored in the preset storage space 30.

Further, in the present third specific embodiment, the read/write method further includes the following step: forming second ECC code corresponding to to-be-written data in the write operation, and writing the second ECC code together with the to-be-written data into the storage cell corresponding to the address information to which the write command points. When data in the storage cell is read, the data and the second ECC code are read simultaneously, and the second ECC code is decoded to restore the data where an error may occur.

In the present third specific embodiment, according to the read/write method of the present disclosure, after a write command is applied to the memory device, an address to which the write command points is compared with address information stored in the preset storage space 30, so as to serve as a basis for executing a write operation on the storage cell, which can then avoid executing a write operation on a valid storage cell, improves the reliability of the memory device, and prolongs the service life of the memory device.

The present disclosure further provides a memory device that can implement the above read/write method. The memory device includes, but is not limited to, a volatile memory such as a DRAM or a SRAM, as well as a non-volatile memory such as a NAND, a NOR, a FeRAM, an RRAM, an MRAM, or a PCRAM.

Figure 4:
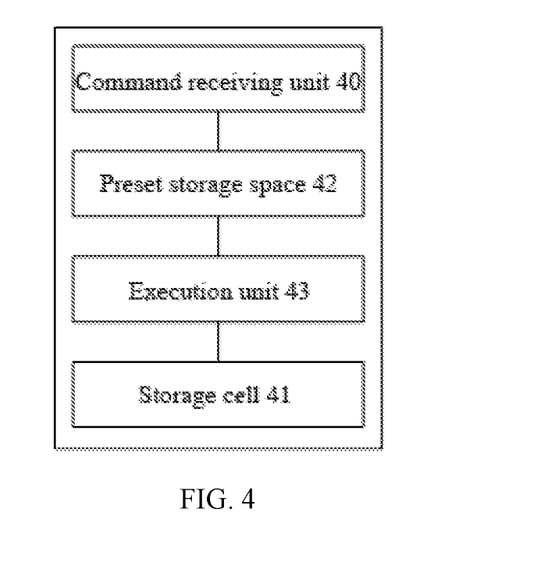
FIG. 4 is a schematic frame diagram of a first specific embodiment of a memory device according to the present disclosure.

Refer to FIG. 4 which is a schematic frame diagram of a first specific embodiment of a memory device according to the present disclosure. The memory device includes a command receiving unit 40, a storage cell 41, a preset storage space 42, and an execution unit 43.

The command receiving unit 40 is configured to receive a read command or a write command applied to the memory device or address information that the read/write command points to.

The storage cell 41 corresponds to the address information corresponding to the read command or the write command, and is configured to store data. In the present disclosure, the storage cell 41 may be a storage unit well-known to those skilled in the art such as basic storage cells, storage segments, storage pages, or storage blocks, which is not limited in the present disclosure.

The preset storage space 42 is configured to store address information corresponding to the storage cell where a data error occurs. The preset storage space 42 may be a SRAM, a DRAM, an MRAM, a register, a latch, a flip-flop, or other structures well-known to those skilled in the art and having a storage function.

The execution unit 43 is configured to execute a read operation or a write operation on the storage cell 41. The execution unit 43 is further connected to the preset storage space 42, and is configured to, according to the address information stored in the preset storage space 42, execute a read operation or a write operation on the storage cell corresponding to the address information to which the read command or the write command points, or stop the read operation or the write operation on the storage cell corresponding to the address information to which the read command or the write command points.

Specifically, if the address information to which the read command or the write command points is not the same as any piece of the address information stored in the preset storage space 42, the execution unit 43 executes a read operation or a write operation on the storage cell corresponding to the address information. If the address information to which the read command or the write command points is the same as one piece of the address information stored in the preset storage space 42, the execution unit 43 stops the read operation or the write operation on the storage cell corresponding to the address information.

It needs to be noted that the execution unit 43 may also be directly connected to the command receiving unit 40, which is not limited in the present disclosure. Those skilled in the art may select a connection manner as required.

Figure 5:
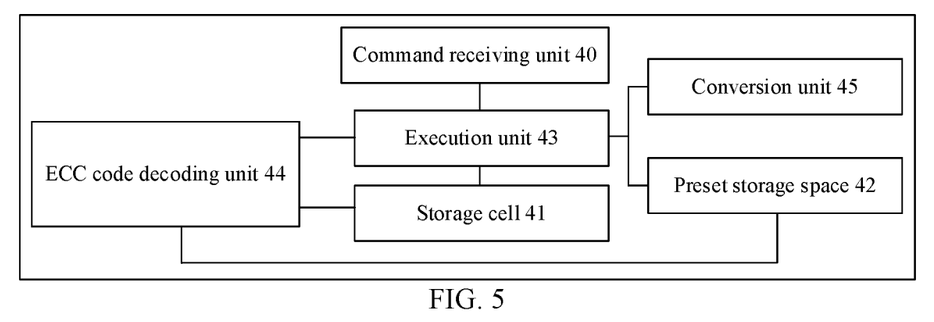
FIG. 5 is a schematic frame diagram of a second specific embodiment of the memory device according to the present disclosure.

Further, a second specific embodiment is further provided for the memory device of the present disclosure. Referring to FIG. 5 which is a schematic frame diagram of a second specific embodiment of the memory device according to the present disclosure, the second specific embodiment differs from the first specific embodiment in that the memory device further includes an ECC code decoding unit 44.

The ECC code decoding unit 44 is connected to the execution unit 43, the storage cell 41, and the preset storage space 42.

The ECC code decoding unit 44 is configured to decode first ECC code corresponding to to-be-read data in the read operation to restore data where an error may occur, and it may be judged, according to whether the ECC code decoding unit 44 restores the data, whether the address information needs to be stored in the preset storage space 42. The ECC code decoding unit 44 is further configured to form second ECC code corresponding to to-be-written data in the write operation.

Specifically, in the present specific embodiment, the command receiving unit receives a write command. When a write operation is executed on a storage cell corresponding to address information to which the write command points, the ECC code decoding unit 44 forms ECC code corresponding to to-be-written data in the write operation, and at the same time, stores the ECC code in the storage cell 41 corresponding to the address information to which the write command points. After the write operation is completed, the ECC code decoding unit 44 decodes the ECC code when a read operation is subsequently executed on the storage cell corresponding to the address information. It may be judged, according to the decoding by the ECC code decoding unit 44, whether an error occurs in to-be-read data read by the read operation, and then it is judged whether the address information needs to be stored in the preset storage space 42.

Further, in the present specific embodiment, it may be judged, according to whether the ECC code decoding unit 44 restores the data, whether the address information needs to be stored in the preset storage space 42. Specifically, if the ECC code decoding unit 44 decodes the ECC code and restores the data, indicating that an error occurs in the to-be-read data read by the read operation, the address information of the storage cell is stored in the preset storage space 42. If the ECC code decoding unit 44 decodes the ECC code but has not yet restored the data, indicating that no error occurs in the to-be-read data read by the read operation, the address information is not stored in the preset storage space 42.

In other specific embodiments of the present disclosure, the ECC code decoding unit 44 decodes the ECC code, although the data is not restored, it may be judged according to the decoding by the ECC code decoding unit 44 that an error occurs in the to-be-read data read by the read operation, and then the address information of the storage cell is stored in the preset storage space 42.

Further, in the second specific embodiment of the memory device, the memory device further includes a conversion unit 45. The conversion unit 45 may be connected to the execution unit 43. The conversion unit 45 changes the address information to which the read command or the write command points into another address information after the read operation or the write operation on the storage cell corresponding to the address information is stopped. The execution unit 43 executes a read operation or a write operation on the another address information again according to marking information of the marking unit.

Figure 6:
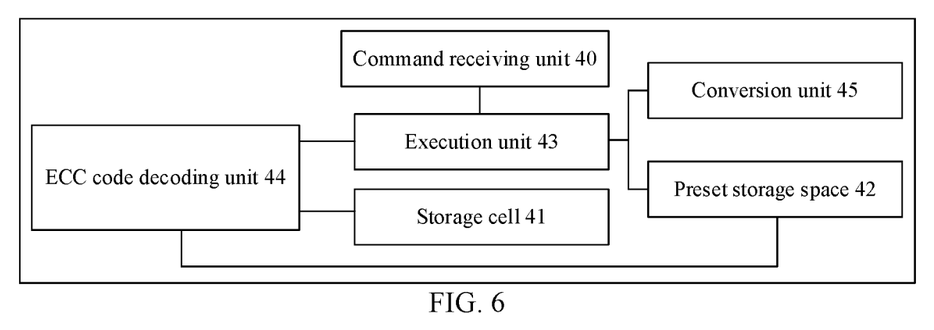
FIG. 6 is a schematic frame diagram of a third specific embodiment of the memory device according to the present disclosure.

In the second specific embodiment, the execution unit 43 is connected not only to the ECC code decoding unit 44 but also to the storage cell 41. However, in a third specific embodiment of the present disclosure, referring to FIG. 6 which is a schematic frame diagram of a third specific embodiment of the memory device, the execution unit 43 is connected to the ECC code decoding unit 44, and the ECC code decoding unit 44 is then connected to the storage cell 41. It can be understood that different connection relationships may be selected according to different requirements.

Figure 7:
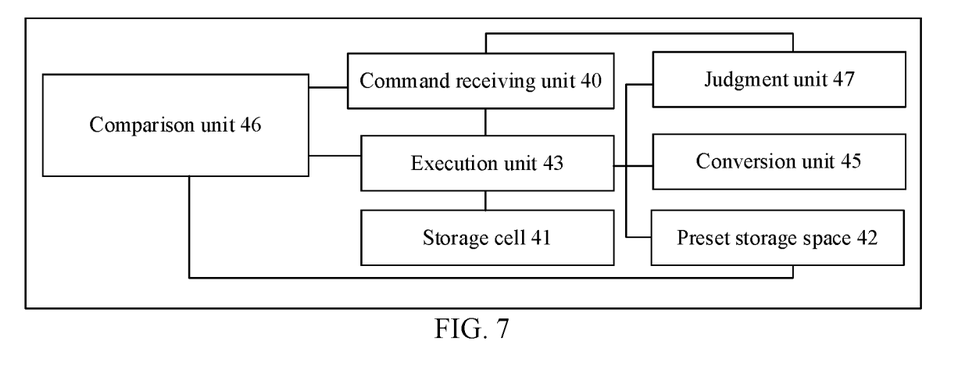
FIG. 7 is a schematic frame diagram of a fourth specific embodiment of the memory device according to the present disclosure.

A fourth specific embodiment is further provided for the memory device of the present disclosure. Referring to FIG. 7 which is a schematic frame diagram of a fourth specific embodiment of the memory device according to the present disclosure, compared with the first specific embodiment of the memory device, the memory device further includes a comparison unit 46. The comparison unit 46 is connected to the command receiving unit 40 and the preset storage space 42 and is configured to compare the address information to which the read command or the write command points with the address information stored in the preset storage space 42.

The execution unit 43 is further connected to the comparison unit 46, and is configured to, according to a result output by the comparison unit 46, execute a read operation or a write operation on the storage cell corresponding to the address information to which the read command or the write command points, or stop the read operation or the write operation on the storage cell corresponding to the address information to which the read command or the write command points.

For example, the comparison unit 46 compares the address information to which the read command or the write command points with the address information stored in the preset storage space 42, if the address information to which the read command or the write command points is not the same as any piece of the address information stored in the preset storage space 42, the comparison unit 46 outputs a signal that can identify the difference to the execution unit 43, and the execution unit 43 executes, according to the signal, a read operation or a write operation on the storage cell corresponding to the address information to which the read command or the write command points. If the address information to which the read command or the write command points is the same as one piece of the address information stored in the preset storage space 42, the comparison unit 46 outputs a signal that can identify the similarity to the execution unit 43, and the execution unit 43 stops, according to the signal, the read operation or the write operation on the storage cell corresponding to the address information to which the read command or the write command points.

It needs to be noted that, although an embodiment of a specific connection relationship is depicted in the drawings, the present disclosure does not specially limit the specific connection manner. It may be understood that those skilled in the art can select different connection relationships according to different requirements.

Further, in the fourth specific embodiment, the memory device further includes a judgment unit 47. The judgment unit 47 is connected to the command receiving unit 40 and the execution unit 43 and is configured to judge whether a write command has been executed on the address information to which the read command points after the address information to which the read command points is stored in the preset storage space 42. The execution unit 43 can execute a write operation on a storage cell corresponding to an output result of the judgment unit 47.

Figure 8:
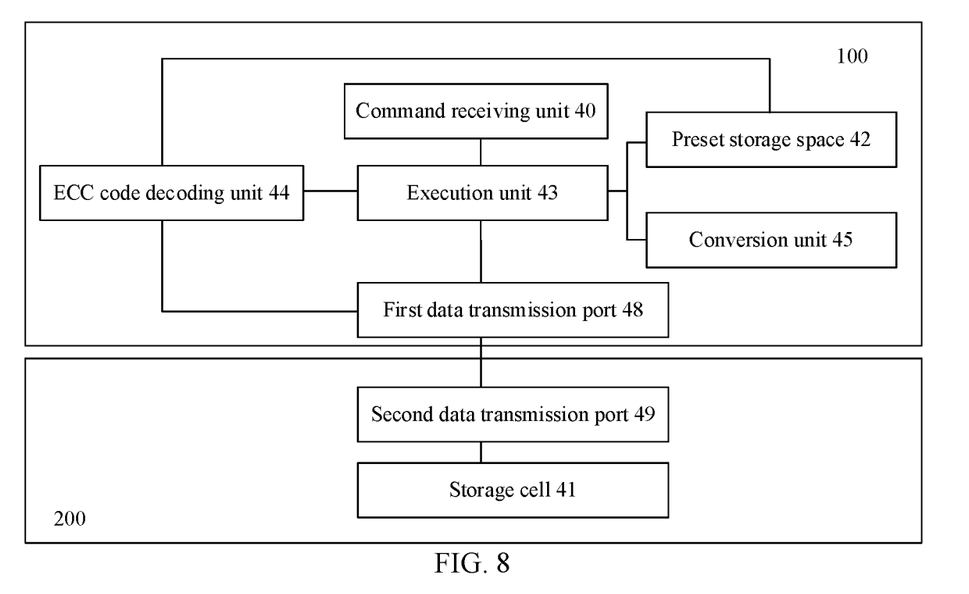
FIG. 8 is a schematic frame diagram of a fifth specific embodiment of the memory device according to the present disclosure.

A fifth specific embodiment is further provided for the memory device of the present disclosure. Referring to FIG. 8 which is a schematic frame diagram of a fifth specific embodiment of the memory device, compared with the second specific embodiment of the memory device, the memory device includes a logical layer 100 and a plurality of storage layers 200 (only one storage layer is shown in the figure). The storage layer 200 may be a DRAM chip, and the logical layer 100 may be a layer with a logic circuit such as a control chip or an intermediary layer. The plurality of storage layers 200 may be vertically stacked above or below the logical layer 100, but the present disclosure is not limited thereto, and the plurality of storage layers may also be integrated together in other encapsulation manners.

The command receiving unit 40, the preset storage space 42, the execution unit 43, the ECC code decoding unit 44, and the conversion unit 45 may be all arranged in the logical layer 100, and the storage cell 41 is arranged in the storage layer 200. In another specific embodiment of the present disclosure, the preset storage space 42 and the ECC code decoding unit 44 may also be arranged in the storage layer 200.

In the present specific embodiment, the logical layer 100 has at least one first data transmission port 48, and the storage layer 200 has at least one second data transmission port 49. The logical layer 100 and the storage layer 200 transmit instructions and data through the first data transmission port 48 and the second data transmission port 49.

Figure 9:
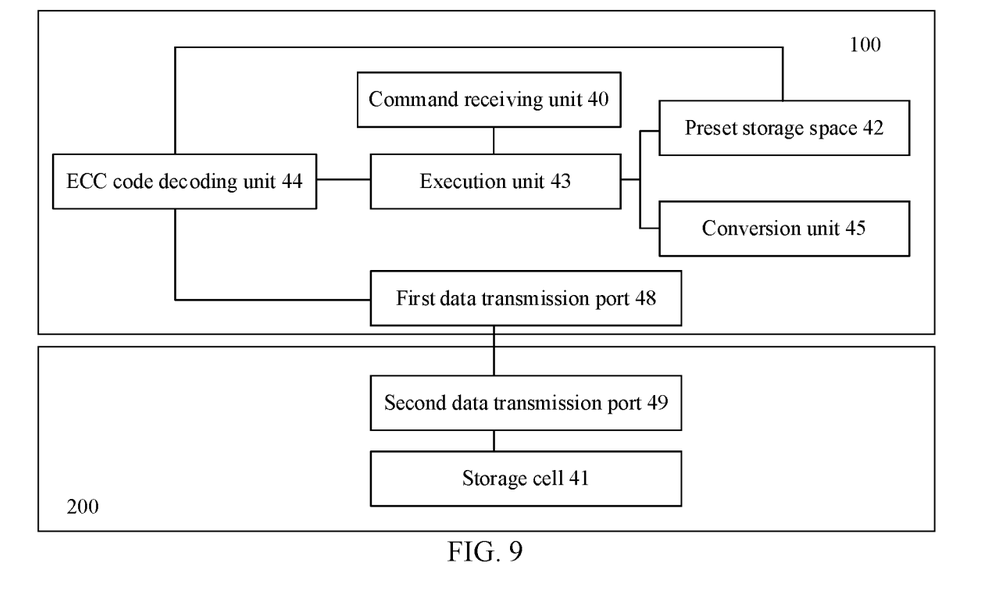
FIG. 9 is a schematic frame diagram of a sixth specific embodiment of the memory device according to the present disclosure.

Further, in the fifth specific embodiment, the execution unit 43 is connected not only to the ECC code decoding unit 44 but also to the storage cell 41 through the first data transmission port 48 and the second data transmission port 49. However, in a sixth specific embodiment of the present disclosure, referring to FIG. 9 which is a schematic frame diagram of a fifth specific embodiment of the memory device, the execution unit 43 is connected to the ECC code decoding unit 44, and the ECC code decoding unit 44 is connected to the storage cell 41 through the first data transmission port 48 and the second data transmission port 49. It can be understood that different connection relationships may be selected according to different requirements.

Further, in other specific embodiments of the present disclosure, the comparison unit 46 and the judgment unit 47 may also be arranged in the logical layer 100.

The memory device of the present disclosure can distinguish address information of an invalid storage cell from address information of a valid storage cell by using a preset storage space during the use by a user, and then a read/write operation can be selectively performed on the storage cell, which greatly improves the reliability and prolongs the service life of the memory device.

The above descriptions are merely preferred embodiments of the present disclosure. It should be noted that, those of ordinary skill in the art may make several improvements and refinements without departing from the principle of the present disclosure. All such modifications and refinements shall also be construed as falling within the protection scope of the present disclosure.

What is claimed is:

1. A read/write method, comprising: applying a read command to a memory device, the read command pointing to address information, reading to-be-read data from a storage cell corresponding to the address information to which the read command points, and storing the address information to which the read command points in a preset storage space if an error occurs in the to-be-read data,
wherein after the applying a read command to a storage device and before the step of reading to-be-read data from a storage cell corresponding to the address information to which the read command points, the method further comprises: comparing the address information to which the read command points with the address information stored in the preset storage space, and executing a read operation on the storage cell corresponding to the address information to which the read command points if the address information to which the read command points is not the same as the address information stored in the preset storage space.

2. The read/write method according to claim 1, wherein if no error occurs in the to-be-read data, the address information to which the read command points is not stored in the preset storage space.

3. The read/write method according to claim 1, wherein the reading to-be-read data from a storage cell corresponding to the address information to which the read command points further comprises: reading first ECC code corresponding to the to-be-read data from the storage cell corresponding to the address information to which the read command points; and
a method of judging whether an error occurs in the to-be-read data comprises: decoding the first ECC code to judge whether an error occurs in the to-be-read data.

4. The read/write method according to claim 1, wherein if the address information to which the read command points is the same as the address information stored in the preset storage space, it is determined whether a write command has been executed on the address information to which the read command points after the address information to which the read command points is stored in the preset storage space, and if yes, the read command points to address information to which the write command points, so as to perform a read operation on a storage cell corresponding thereto.

5. A read/write method, comprising:
applying a read command to a memory device, the read command pointing to address information, reading to-be-read data from a storage cell corresponding to the address information to which the read command points, and storing the address information to which the read command points in a preset storage space if an error occurs in the to-be-read data; and
applying a write command to the memory device, comparing address information to which the write command points with the address information stored in the preset storage space, executing a write operation on a storage cell corresponding to the address information to which the write command points if the address information to which the write command points is not the same as the address information stored in the preset storage space, and stopping the write operation on the storage cell corresponding to the address information to which the write command points if the address information to which the write command points is the same as the address information stored in the preset storage space.

6. The read/write method according to claim 5, wherein after the stopping the write operation on the storage cell corresponding to the address information to which the write command points, the method further comprises: changing the address information to which the write command points into another address information.

7. The read/write method according to claim 6, wherein after the changing the address information to which the write command points into another address information, the method further comprises: comparing the another address information with the address information stored in the preset storage space, stopping the write operation on a storage cell corresponding to the another address information if the another address information is the same as the address information stored in the preset storage space, and executing the write operation on the storage cell corresponding to the another address information if the another address information is not the same as the address information stored in the preset storage space.

8. The read/write method according to claim 5, wherein the executing a write operation on a storage cell corresponding to the address information to which the write command points further comprises:
forming second ECC code corresponding to to-be-written data in the write operation, and writing the second ECC code together with the to-be-written data into the storage cell corresponding to the address information to which the write command points.

9. The read/write method according to claim 5, wherein after the applying a read command to a storage device and before the step of reading to-be-read data from a storage cell corresponding to the address information to which the read command points, the method further comprises: comparing the address information to which the read command points with the address information stored in the preset storage space, and executing a read operation on the storage cell corresponding to the address information to which the read command points if the address information to which the read command points is not the same as the address information stored in the preset storage space.

10. The read/write method according to claim 9, wherein if the address information to which the read command points is the same as the address information stored in the preset storage space, it is determined whether the write command has been executed on the address information to which the read command points after the address information to which the read command points is stored in the preset storage space, and if yes, the read command points to address information to which the write command points, so as to perform a read operation on the storage cell corresponding thereto.

11. A memory device, comprising:
a command receiving unit configured to receive a read command or a write command;
a storage cell corresponding to address information to which the read command or the write command points;
an execution unit configured to execute a read operation or a write operation on the storage cell; and
a preset storage space configured to store address information corresponding to the storage cell where a data error occurs;
wherein the memory device further comprises a comparison unit, and the comparison unit is connected to the command receiving unit and the preset storage space and is configured to compare the address information to which the read command or the write command points with the address information stored in the preset storage space; and
wherein the execution unit is further connected to the comparison unit, and is configured to, according to a result output by the comparison unit, execute a read operation or a write operation on the storage cell corresponding to the address information to which the read command or the write command points, or stop the read operation or the write operation on the storage cell corresponding to the address information to which the read command or the write command points.

12. The memory device according to claim 11, wherein the memory device further comprises an ECC code decoding unit configured to decode first ECC code corresponding to to-be-read data in the read operation and form second ECC code corresponding to to-be-written data in the write operation.

13. The memory device according to claim 11, wherein the memory device further comprises a judgment unit, and the judgment unit is connected to the command receiving unit and the execution unit and is configured to judge whether a write command has been executed on the address information to which the read command points after the address information to which the read command points is stored in the preset storage space.

14. The memory device according to claim 11, wherein the memory device further comprises a conversion unit configured to change the address information to which the read command or the write command points into another address information after the read operation or the write operation on the storage cell corresponding to the address information to which the read command or the write command points is stopped.

15. The memory device according to claim 11, wherein the memory device comprises a logic layer and at least one storage layer, the command receiving unit and the execution unit are arranged in the logic layer, the storage cell is arranged in the storage layer, and the preset storage space is arranged in the storage layer or the logic layer.

* * * * *